United States Patent
Kang et al.

(10) Patent No.: US 9,510,457 B2
(45) Date of Patent: Nov. 29, 2016

(54) METHODS OF MANUFACTURING METAL WIRING BURIED FLEXIBLE SUBSTRATE BY USING PLASMA AND FLEXIBLE SUBSTRATES MANUFACTURED BY THE SAME

(75) Inventors: Jae Wook Kang, Gyeongsangnam-do (KR); Do Geun Kim, Gyeongsangnam-do (KR); Jong Kuk Kim, Gyeongsangnam-do (KR); Sung Hun Jung, Seoul (KR); Seunghun Lee, Gyeongsangnam-do (KR)

(73) Assignee: Korea Institute of Machinery and Minerals, Daejeon (KR)

( * ) Notice: Subject to any disclaimer, the term of this patent is extended or adjusted under 35 U.S.C. 154(b) by 482 days.

(21) Appl. No.: 14/004,560

(22) PCT Filed: Jul. 30, 2012

(86) PCT No.: PCT/KR2012/006053
§ 371 (c)(1),
(2), (4) Date: Sep. 11, 2013

(87) PCT Pub. No.: WO2013/176336
PCT Pub. Date: Nov. 29, 2013

(65) Prior Publication Data
US 2014/0034364 A1    Feb. 6, 2014

(30) Foreign Application Priority Data
May 21, 2012   (KR) .................... 10-2012-0053626

(51) Int. Cl.
*H05K 3/00* (2006.01)
*H05K 1/03* (2006.01)
*H05K 3/20* (2006.01)
*H05K 1/02* (2006.01)
*H05K 3/10* (2006.01)

(52) U.S. Cl.
CPC .......... *H05K 3/0041* (2013.01); *H05K 1/0283* (2013.01); *H05K 1/03* (2013.01); *H05K 3/101* (2013.01); *H05K 3/20* (2013.01); *H05K 3/207* (2013.01); *H05K 1/0393* (2013.01); *H05K 2201/0326* (2013.01); *H05K 2201/0376* (2013.01); *H05K 2201/10037* (2013.01); *H05K 2201/10098* (2013.01); *H05K 2201/10128* (2013.01); *H05K 2203/016* (2013.01); *H05K 2203/0139* (2013.01); *H05K 2203/0264* (2013.01); *H05K 2203/095* (2013.01)

(58) Field of Classification Search
CPC .............................. H05K 3/0041; H05K 1/03
See application file for complete search history.

(56) References Cited

FOREIGN PATENT DOCUMENTS

| | | |
|---|---|---|
| JP | 2000003944 A | 1/2000 |
| JP | 2005057183 A | 3/2005 |

(Continued)

*Primary Examiner* — Jeremy C Norris
(74) *Attorney, Agent, or Firm* — Fredrikson & Byron, P.A.

(57) ABSTRACT

Disclosed are methods of manufacturing a metal wiring buried flexible substrate by using plasma and flexible substrates manufactured by the same. The method includes pre-treating a substrate by irradiating the plasma on the surface of the substrate (Step 1), forming a metal wiring on the pre-treated substrate in Step 1 (Step 2), forming a metal wiring buried polymer layer by coating a curable polymer on the substrate including the metal wiring formed thereon in Step 2 and curing (Step 3), and separating the polymer layer formed in Step 3 from the substrate in Step 1 (Step 4). The metal wiring may be inserted into the flexible substrate, and the resistance of the wiring may be decreased. The metal wiring may be clearly separated from the substrate, and impurities on the substrate surface may be clearly removed. The flexible substrate may be easily separated by applying only physical force.

15 Claims, 12 Drawing Sheets

(56) References Cited

FOREIGN PATENT DOCUMENTS

| | | |
|---|---|---|
| JP | 2005136318 A | 5/2005 |
| JP | 2005223167 A | 8/2005 |
| JP | 2006190748 A | 7/2006 |
| KR | 1020040097228 A | 11/2004 |
| KR | 100735339 B1 | 7/2007 |
| KR | 1020100027526 A | 3/2010 |
| KR | 1020100115297 A | 10/2010 |

Glass substrate

Before plasma irradiating  (CF₄ plasma)  After plasma irradiating

Si wafer substrate

Before plasma irradiating  (N₂O plasma)  After plasma irradiating

STS steel substrate

Before plasma irradiating     (CF$_4$ plasma)     After plasma irradiating

Glass substrate

Before plasma irradiating     (O$_2$ plasma)     After plasma irradiating

CF$_4$ treated Glass substrate

Before plasma irradiating (CF$_4$ plasma) After plasma irradiating

PES substrate

Before plasma irradiating (O$_2$ plasma) After plasma irradiating

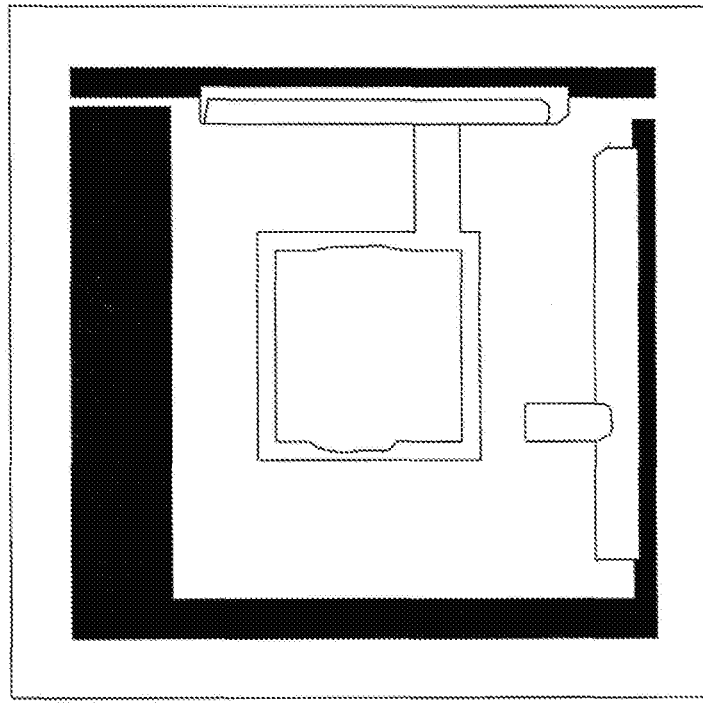
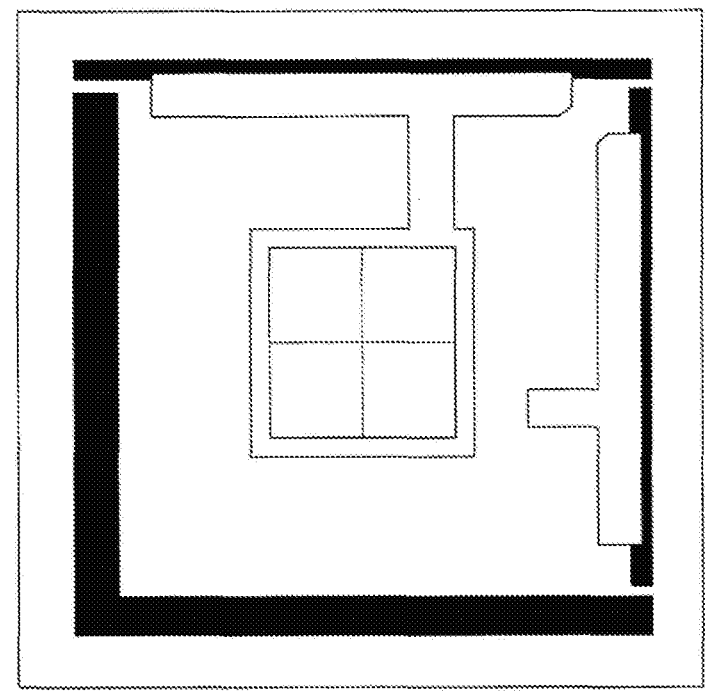
Fig. 14

Fig. 15
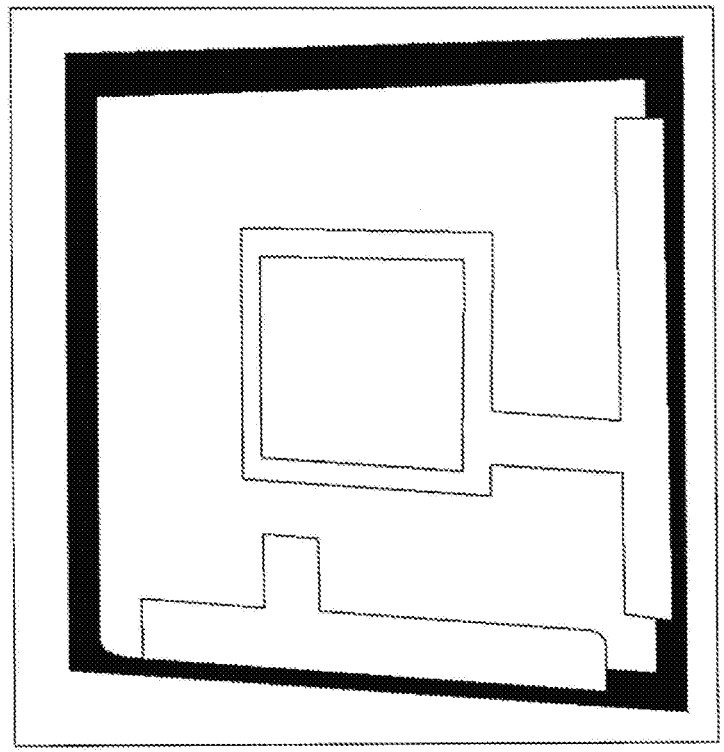
Comparative Example 5
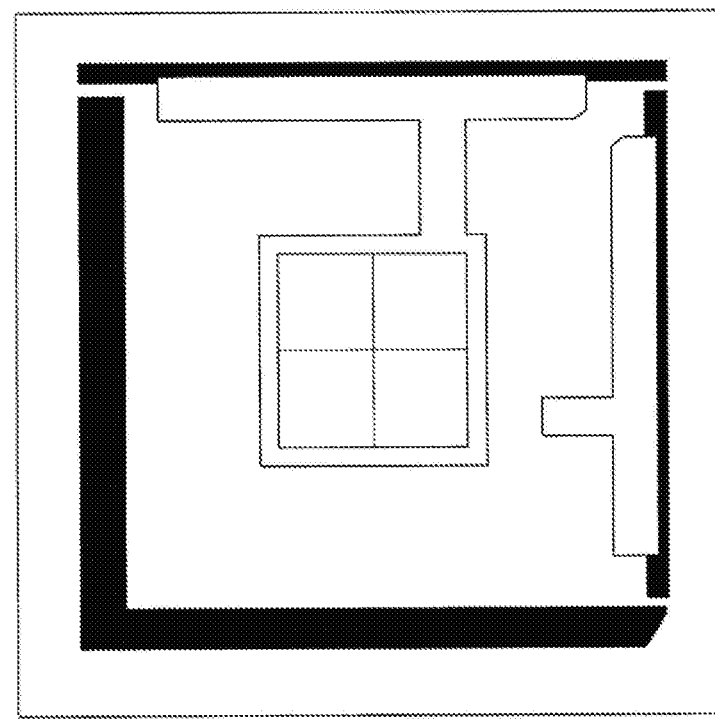
Example 4

METHODS OF MANUFACTURING METAL WIRING BURIED FLEXIBLE SUBSTRATE BY USING PLASMA AND FLEXIBLE SUBSTRATES MANUFACTURED BY THE SAME

TECHNICAL FIELD

The present disclosure relates to methods of manufacturing a metal wiring buried flexible substrate by using a plasma and flexible substrates manufactured by the same.

BACKGROUND ART

Recently, various home appliances and electronic products have been developed in line with the technical development in electric industry and electronic industry. Most of the home appliances and the electronic products include a circuit substrate, into which an electric device, an electronic device and a semiconductor package may be inserted. The circuit substrate includes a circuit wiring for an electric connection of the electric device, the electronic device and the semiconductor package. Commonly used circuit wirings may be formed by patterning a metal layer formed on an insulating substrate. When the circuit wirings formed on the insulating substrate intersect on the same plane, a short between the circuit wirings may be generated. Thus, a common circuit substrate may include multi-layer circuit patterns electrically insulated from each other. However, a very complicated process is necessary for manufacturing the multi-layer circuit patterns on the circuit substrate, and the verification of the generation of a wiring defect during performing the manufacturing process may be difficult. Particularly, for a recently developed wafer level package, in which a circuit wiring may be directly formed on a semiconductor chip, the formation of a multi-layer circuit substrate may be very difficult because the area of the wafer level package is very small.

Meanwhile, the width of the wiring becomes narrower to form a large number of more complicated wirings on a substrate. The cross-sectional area of the wiring may be decreased according to the decrease of the width of the wiring. Thus, the resistance of the wiring may be increased, power efficiency may be decreased and heat may be generated. In order to solve the above-described defects, (1) a specific resistance ($\rho$) is necessary to be lowered, (2) a wiring length is necessary to be decreased, or (3) a wiring height (thickness) is necessary to be increased. With respect to method (1), the development of a material having a lower specific resistance than that of widely used copper, aluminum or silver may be difficult. With respect to method (2), practical application may be difficult concerning a circuit designing matter. With respect to method (3), the wiring may collapse, or a short between wirings may be generated in line with the increase of the height of the wiring.

Accordingly, a technique on inserting a metal wiring into a substrate is necessary. As for common methods of inserting the metal wiring into the substrate, an etching method for obtaining a desired pattern through a deposition and etching, and a damascene method of inlaying a wiring into a groove in an insulating layer by applying a copper (Cu) film, which may be hardly dry etched for forming a pattern and a CMP method, may be illustrated.

According to the above-described common methods, lots of materials may be consumed, and the process may be conducted through various steps including deposition, patterning, etching, etc. and may be complicated. In addition, since the metal layer is formed by an electroplating method, etc., a heat treatment at a high temperature may be necessary. In this case, a non-conductive material having a high temperature resistance may be required.

In Japanese Laid-open Patent Publication No. 2005-136318, a wiring substrate including a buried wiring in a transparent resin member is disclosed. Disclosed also is a method of manufacturing a wiring substrate including a wiring forming process for forming a metal wiring on a substrate, an integrating process for forming a transparent resin member by coating and drying a transparent resin solution to cover the metal wiring, and a separating process for separating the transparent resin member from the substrate. In the manufacturing method, an organic separator such as a silicon resin, a fluorine resin, etc. and an inorganic separator such as a diamond like carbon (DLC) thin film, a zirconium oxide thin film, etc. may be formed on the surface of the substrate in advance to facilitate the separating process.

However, when the inorganic separator is used, the separation of the wiring and the member may not be easily performed while conducting the separating process of the member and the metal wiring from the substrate. In this case, a portion of the metal wiring and the member may remain on the surface of the substrate, and the organic material used as the separator may stain the wiring and the surface of the member. That is, the metal wiring of the wiring substrate may be incompletely separated from the substrate even though using the separator.

The present inventors have been studied on methods of manufacturing a flexible substrate having a dented (buried) type metal wiring and completed a method of clearly separating a metal wiring and a polymer material from a substrate by treating the surface of a substrate using a plasma and then, forming the metal wiring and the polymer material (flexible substrate) on the substrate.

DISCLOSURE OF THE INVENTION

Technical Problem

One object of the present invention is to provide a method of manufacturing a metal wiring buried flexible substrate by using a plasma and a flexible substrate manufactured by the same.

Technical Solution

In order to achieve the object, the present invention provides a method of manufacturing a metal wiring buried flexible substrate by using a plasma including:

pre-treating a substrate by irradiating the plasma on the surface of the substrate (Step 1);

forming a metal wiring on the substrate pre-treated in Step 1 (Step 2);

forming a metal wiring buried polymer layer by coating a curable polymer on the substrate including the metal wiring formed thereon in Step 2 and curing (Step 3); and separating the polymer layer formed in Step 3 from the substrate in Step 1 (Step 4).

The present invention also provides a metal wiring buried flexible substrate manufactured by the above described method, in which a polymer layer and a metal wiring are integrated one by one, and the metal wiring is provided in the polymer layer.

Advantageous Effects

According to the method of manufacturing a metal wiring buried flexible substrate by using a plasma, a metal wiring may be inserted into the flexible substrate, and a wiring having a low resistance irrespective of the height of the metal wiring may be formed. In addition, through treating the surface of the substrate by using the plasma, the metal wiring buried flexible substrate may be clearly separated from the substrate. In addition, impurities on the surface of the substrate may be removed through the plasma treatment and the metal wiring buried flexible substrate may be clearly separated from the substrate by applying only a physical force without performing any separate process.

BRIEF DESCRIPTION OF THE DRAWINGS

FIG. 14 illustrates photographs for showing the difference on the separated state of a metal wiring according to a plasma irradiation of a substrate before forming the metal wiring; and FIG. 15 illustrates photographs on the coated state of a curable polymer (flexible substrate) according to a plasma irradiation of a substrate before forming a metal wiring.

BEST MODE FOR CARRYING OUT THE INVENTION

Figure 1:
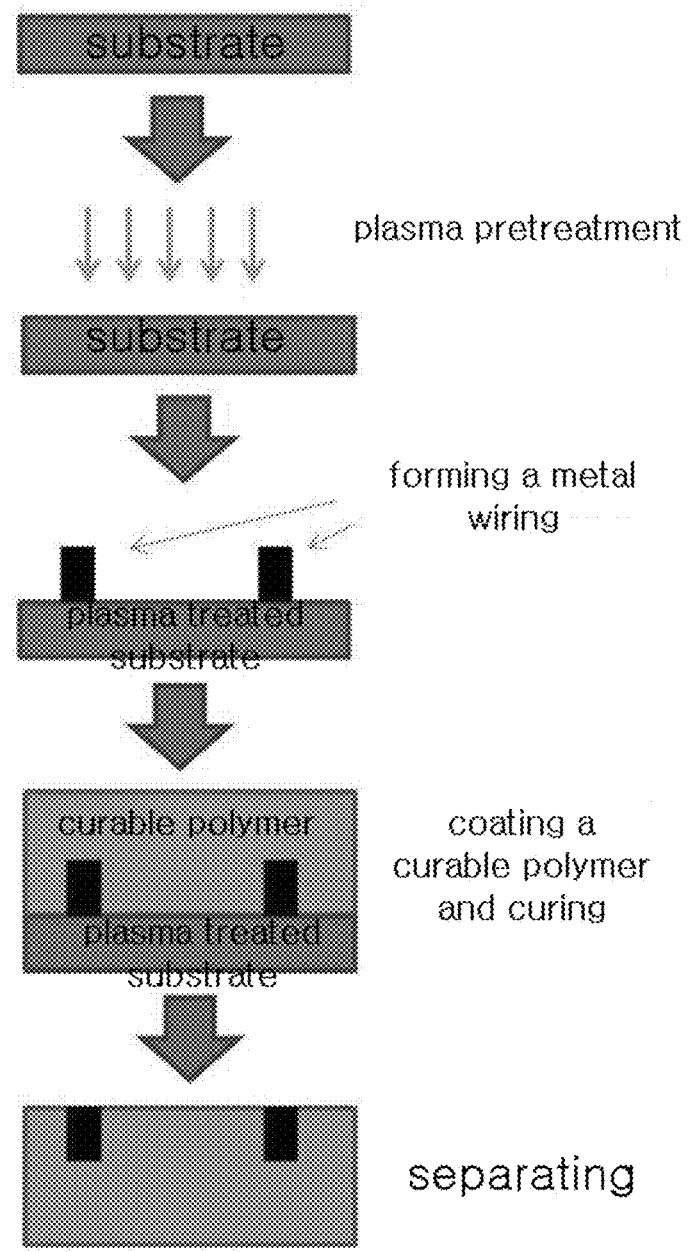
FIGS. 1 and 2 are schematic diagrams illustrating a method of manufacturing a metal wiring buried flexible substrate step by step according to the present invention.

According to the present invention, there is provided a method of manufacturing a metal wiring buried flexible substrate by using a plasma including:

pre-treating a substrate by irradiating a plasma on the surface of the substrate (Step 1);

forming a metal wiring on the substrate pre-treated in Step 1 (Step 2);

forming a metal wiring buried polymer layer by coating a curable polymer on the substrate including the metal wiring formed thereon in Step 2 and curing (Step 3); and separating the polymer layer formed in Step 3 from the substrate in Step 1 (Step 4).

Hereinafter, the present invention will be described in detail step by step.

In the method of manufacturing the metal wiring buried flexible substrate according to the present invention, Step 1 corresponds to a step of pre-treating the substrate by irradiating a plasma on the surface of the substrate.

The pre-treatment of the surface of the substrate by irradiating the plasma in Step 1 is conducted for easily separating the metal wiring and the curable polymer to be coated on the substrate from the substrate. That is, the surface property of the substrate may be changed through the plasma treatment to facilitate the separation of the metal wiring and the curable polymer from the substrate.

Preferably, examples of the plasma used in Step 1 may include at least one selected from the group consisting of Ar, $N_2O$, $CF_4$, $CH_4$, $C_2H_2$, $H_2O$, $C_2H_5OH$, hexamethyldisiloxane (HMDSO) and tetramethylsilane (TMS). By irradiating the plasma on the substrate, the surface property of the substrate may be changed and the impurities present on the surface of the substrate may be removed. Particularly, when a glass substrate is irradiated with a $CF_4$ plasma, a fluorine functional group may be formed on the surface of the glass substrate to change the surface into hydrophobic. When a silicon (Si) substrate is irradiated with a $N_2O$ plasma, a micro oxide layer may be removed from the surface of the silicon (Si) substrate to change the surface into hydrophobic. The plasma may be appropriately selected according to process conditions such as a pressure, an applying voltage, etc. and may not be limited to the plasma used in Step 1.

The surface of the substrate irradiated with the plasma in Step 1 may be changed to have a releasing property. Accordingly, an adhesiveness of the substrate with the metal wiring and the curable polymer may be lowered, and the separation of the metal wiring and the curable polymer from the substrate may become easy. The change of the separating property is due to the releasing property of the surface of the substrate obtained after the plasma treatment. The degree of the releasing property may include a contacting angle with respect to water (hydrophilicity).

In this case, the contacting angle of the surface of the substrate pre-treated by irradiating the plasma in Step 1 with respect to water is preferably 45° to 150°. When the surface of the pre-treated substrate has the contacting angle with respect to water in the above described range, the releasing property may be illustrated with respect to the metal wiring and the curable polymer to facilitate the separation of the metal wiring and the curable polymer from the substrate. When the contacting angle of the surface of the pre-treated substrate with respect to water is less than 45°, the metal wiring formed on the substrate may not be separated easily, and when the contacting angle of the surface of the pre-treated substrate exceeds 150°, the coating of the metal wiring on the substrate may become difficult.

Meanwhile, the contacting angle of the surface of the substrate pre-treated by irradiating the plasma in Step 1 with respect to water is more preferably 45° to 90°. In this case, the releasing property of the pre-treated substrate with respect to the metal wiring and the curable polymer may be obtainable. In addition, the coating of the curable polymer may be easily conducted.

Concerning the coating of the curable polymer, the curable polymer may be uncoated on the surface of the substrate when the surface of the pre-treated substrate have the contacting angle with respect to water of greater than 120° to less than or equal to 150°. That is, when the surface of the substrate is hydrophobic, the formation of a thin film from the coated curable polymer may become difficult. Therefore, when the contacting angle of the surface of the pre-treated substrate with respect to water is greater than 120° to less than or equal to 150°, an additional plasma treatment may be conducted before coating the curable polymer to make the contacting angle of the surface of the pre-treated substrate with respect to water be 0 to 90°. By conducting the additional treatment, the curable polymer may be readily coated on the substrate. In addition, the metal wiring (particularly, wiring formed through a printing process) may be sintered to accomplish an effect of lowering the resistance of the metal wiring. In this case, the plasma of Ar, $N_2O$, $CF_4$, $CH_4$, $C_2H_2$, $H_2O$, $C_2H_5OH$, etc. may be used, and may be appropriately selected according to process conditions such as a pressure, an applying voltage, etc.

In the method of manufacturing the flexible substrate according to the present invention, Step 2 corresponds to a step of forming a metal wiring on the pre-treated substrate in Step 1.

The metal wiring may be formed by coating or depositing on a pre-treated substrate with a metal such as silver (Ag), copper (Cu), aluminum (Al), gold (Au), platinum (Pt), nickel (Ni), etc. or an alloy thereof, or with at least one conductive metal oxide selected from indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO—Ag—IZO), indium zinc tin oxide-silver-indium zinc tin oxide (IZTO-Ag-IZTO), aluminum zinc oxide-silver-aluminum zinc oxide (AZO-Ag-AZO), etc. by means of an inkjet printing, a gravure printing, a gravure offset, an aerosol printing, an electroplating, a vacuum deposition, a thermal deposition, a sputtering, an electron beam deposition, etc.

In the method of manufacturing the flexible substrate according to the present invention, Step 3 corresponds to a step of forming a metal wiring buried polymer layer by coating a curable polymer on the substrate including the metal wiring formed thereon in Step 2 and curing.

The curable polymer in Step 3 may include polyethylene terephthalate (PET), polyethylene sulfone (PES), polyethylene naphthalate (PEN), polycarbonate (PC), polymethyl methacrylate (PMMA), polyimide (PI), ethylene vinyl acetate (EVA), amorphous polyethylene terephthalate (APET), polypropylene terephthalate (PPT), polyethylene terephthalate glycerol (PETG), polycyclohexylene dimethylene terephthalate (PCTG), modified triacetyl cellulose (TAC), cycloolefin polymer (COP), cycloolefin copolymer (COC), dicyclopentadiene polymer (DCPD), cyclopentadiene polymer (CPD), polyarylate (PAR), polyether imide (PEI), polydimethyl siloxane (PDMS), a silicon resin, a fluorine resin, a modified epoxy resin, etc. After being coated on the metal wiring, the curable polymer may be cured by an appropriate curing method according to the polymer property, for example, a thermal curing, an ultraviolet curing, a moisture curing, a microwave curing, an infrared (IR) curing, etc. to form a polymer layer, that is, a flexible substrate. In this case, the coating may be conducted by a coating method possibly conducted through a liquid process such as a doctor blading, a bar coating, a spin coating, a dip coating, a micro gravure, an imprinting, an inkjet printing, a spray method, etc. without limitation.

In the method of manufacturing the flexible substrate according to the present invention, Step 4 corresponds to a step of separating the polymer layer formed in Step 3 from the substrate in Step 1.

In the polymer layer formed in Step 3, the metal wiring is present as a buried state. By separating the polymer layer from the substrate in Step 1, a metal wiring buried flexible substrate may be manufactured in Step 4. The separation in Step 4 may be conducted by any methods for separating the substrate and the polymer layer and may be desirably conducted by applying a physical force. Since the surface of the substrate is changed to have a releasing property through the plasma pre-treatment in Step 1, the metal wiring and the curable polymer coated on the surface of the substrate may not attached onto the substrate, and the separation may be easily conducted.

Figure 2:
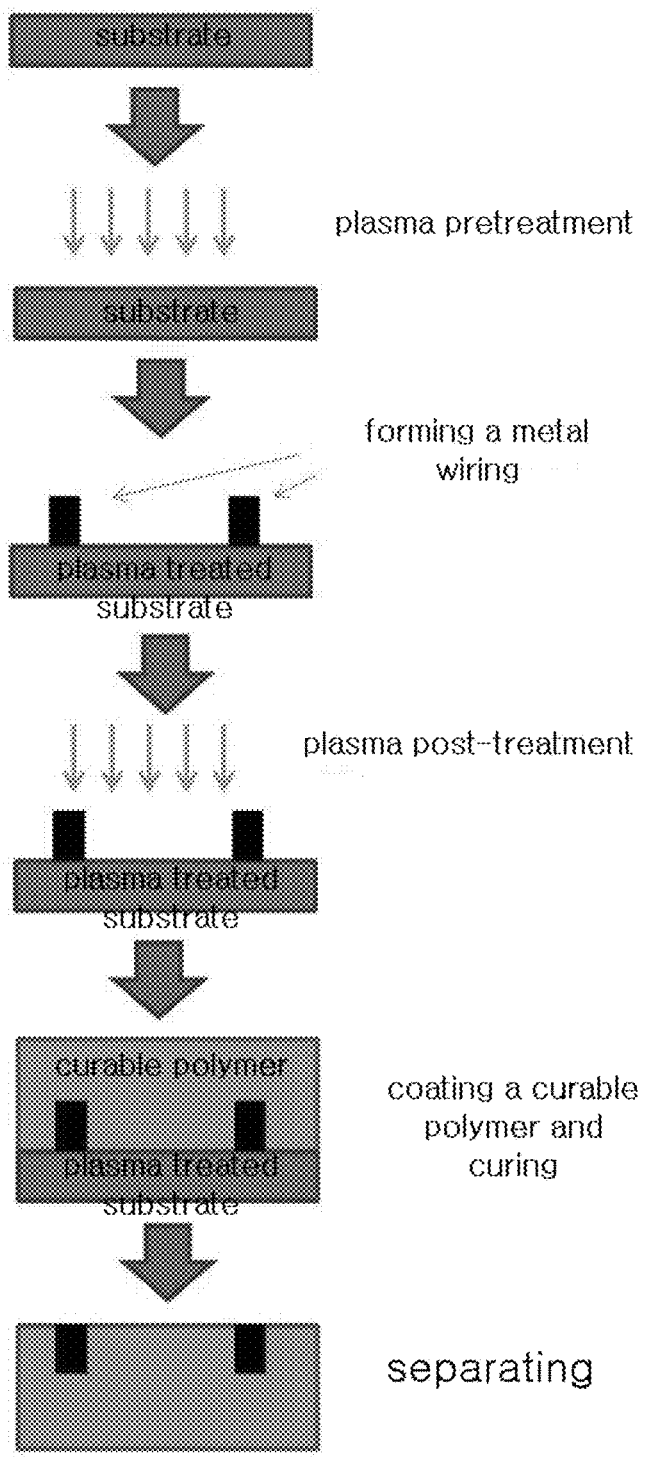

FIGS. 1 and 2 are schematic diagrams illustrating a method of manufacturing a flexible substrate step by step according to the present invention. As illustrated in FIGS. 1 and 2, a metal wiring buried flexible substrate may be manufactured by applying a plasma treatment in the method of manufacturing the flexible substrate according to the present invention. When comparing with a common technique on manufacturing a flexible substrate by separating a metal wiring and a transparent resin membrane using a separating agent, the metal wiring may be more clearly separated according to the present invention. That is, the metal wiring coated on the substrate may be hardly separated and a desired metal wiring pattern may not be formed when using the common separating agent. Sometimes, the separating agent may remain on the flexible substrate as impurities. However, in the manufacturing method of the present invention, the substrate is pre-treated by using the plasma. Thus, the coated metal wiring pattern (or shape) may be maintained after being separated from the substrate. In addition, the separation may be easily conducted by applying only a physical force without conducting any other separating process.

According to the present invention, there is provided a metal wiring buried flexible substrate manufactured by the above described method, in which a polymer layer and a metal wiring are integrated one by one, and the metal wiring is provided in the polymer layer.

Since the metal wiring buried flexible substrate according to the present invention is manufactured by the method as described above, the metal wiring may be present in a buried state in the polymer layer. Commonly, in order to manufacture a metal wiring in a buried state, a separating material such as diamond like carbon (DLC), etc. has been used to solve defects concerning the residues of a separating material as impurities or the damage of a metal wiring pattern (or shape). When a common separating material is used, the pattern of the metal wiring may be damaged and the original shape of the metal wiring may not be maintained. Sometimes, since the separating material may remain on the metal wiring and the flexible substrate as impurities, an application of the substrate in a recently developed electronic device such as a display, a solar battery, etc. may become difficult.

On the other hand, the metal wiring buried flexible substrate according to the present invention may be manufactured excluding residual impurities on the metal wiring and the flexible substrate and maintaining the metal wiring pattern or an initially coated pattern shape by pre-treating the substrate using the plasma. Accordingly, the flexible substrate according to the present invention may be used as a substrate of a solar battery, a flat lighting, an e-paper, a touch panel or a display.

In addition, the flexible substrate may be used as an auxiliary electrode of a material for a printed wiring board (PCB), a substrate for a solar battery, a substrate for displaying, a substrate for a radio frequency identification (RFID), a substrate for a sensor or a substrate for a secondary battery, and may be applied in all electronic devices requiring a flexible substrate.

MODE FOR CARRYING OUT THE INVENTION

Hereinafter, the present invention will be described in more detail through example embodiments. However, the following examples are illustrated only for the explanation of the present invention and will not limit the scope of the present invention.

Example 1

Manufacture of a Metal Wiring Buried Flexible Substrate 1

Step 1: After cleaning a glass substrate using acetone and isopropyl alcohol, a $CF_4$ plasma treatment (process condition: treatment at an $CF_4$ gas of 1 sccm, an Ar gas of 9 sccm, a process pressure of 10 mTorr, and an RF power of 300 W for 300 seconds) was conducted to modify the surface of the substrate to have a hydrophobic property. In this case, the contacting angle of the pre-treated glass substrate with respect to water was 101°.

Step 2: By using a gravure offset printing apparatus, an Ag paste (silver nano paste DGP, nano new material (ANP)) was coated on the pre-treated glass substrate in Step 1 to form an Ag wiring having a line width of 20 to 500 μm and an interval of 20 to 2,000 μm. The thus formed wiring was heat treated on a hot-plate of 200° C. for 1 hour. After performing the heat treatment, the thickness of the Ag wiring was about 1 to 2 μm.

Step 3: On the Ag wiring formed in Step 2 and the glass substrate, an Ar plasma (process condition: an Ar gas of 100 sccm, a process pressure of 0.1 Torr, and an RF power of 150 W) was irradiated for 30 seconds. In this case, the contacting angle of the plasma irradiated glass substrate with respect to water was 25°.

Step 4: On the Ag wiring irradiated by the plasma in Step 3, an ultraviolet (UV)-curable polymer (NOA74: norland optical adhesives 74) was coated to a liquid state film having a certain thickness by means of a doctor blading method and was cured by irradiating an ultraviolet light having a wavelength of 365 nm, to form a polymer layer having a thickness of 2 to 400 μm.

Step 5: The polymer layer formed in Step 4 was separated from the substrate in Step 1 by applying a physical force to form an Ag wiring buried flexible substrate.

Example 2

Manufacture of a Metal Wiring Buried Flexible Substrate 2

Step 1: After cleaning a glass substrate using acetone and isopropyl alcohol, a $CF_4$ plasma treatment (process condition: treatment at an $CF_4$ gas of 1 sccm, an Ar gas of 9 sccm, a process pressure of 10 mTorr, and an RF power of 300 W for 300 seconds) was conducted to modify the surface of the substrate to have a hydrophobic property. In this case, the contacting angle of the pre-treated glass substrate with respect to water was 101°.

Step 2: By using a gravure offset printing apparatus, an Ag paste (silver nano paste DGP, nano new material (ANP)) was coated on the pre-treated glass substrate in Step 1 to form an Ag wiring having a line width of 20 to 500 μm and an interval of 20 to 2,000 μm. The thus formed wiring was He plasma treated (process condition: a process pressure of 500 torr, power: 500 W, time period: 10 minutes, temperature: room temperature, electrode rotor number: 1500 rpm, substrate moving velocity: 5 mm/s, distance between electrode substrates: 1 mm) for sintering. In this case, the contacting angle of the plasma irradiated glass substrate with respect to water was 37°.

Step 3: On the Ag wiring formed in Step 2, a heat-curable polymer (polyimide, VTEC 080-051) was coated to a liquid state film having a certain thickness by a doctor blading method and cured in an oven of 200° C. to manufacture a polymer layer having a thickness of 2 to 400 μm.

Step 4: The polymer layer formed in Step 3 was separated from the glass substrate in Step 1 by applying a physical force to form an Ag wiring buried flexible substrate.

Example 3

Manufacture of a Metal Wiring Buried Flexible Substrate 3

An Ag wiring buried flexible substrate was manufactured by conducting the same procedure explained in Example 1 except for using an STS steel sheet instead of the glass substrate in Step 1 in Example 1. In this case, the contacting angle of the pre-treated STS substrate with respect to water was 107°, and the contacting angle of the STS substrate after the plasma treatment with respect to water was 82°.

Example 4

Manufacture of a Metal Wiring Buried Flexible Substrate 4

An Ag wiring buried flexible substrate was manufactured by conducting the same procedure explained in Example 1 except for irradiating an $O_2$ plasma instead of the Ar plasma for the plasma post-treatment in Step 3 in Example 1. In this case, the contacting angle of the pre-treated glass substrate with respect to water was 101°, and the contacting angle of the glass substrate after the plasma treatment with respect to water was 18°.

Example 5

Manufacture of a Metal Wiring Buried Flexible Substrate 5

An Ag wiring buried flexible substrate was manufactured by conducting the same procedure explained in Example 3 except for irradiating an $H_2$ plasma instead of the He plasma for the plasma post-treatment in Step 2 in Example 3. In this case, the contacting angle of the pre-treated STS substrate with respect to water was 107°, and the contacting angle of the STS substrate after the plasma treatment with respect to water was 81°.

Example 6

Manufacture of a Metal Wiring Buried Flexible Substrate 6

Step 1: An $N_2O$ plasma treatment (process condition: treatment at an $N_2O$ gas of 100 sccm, a process pressure of 5 mTorr, and an RF power of 500 W for 300 seconds) was conducted to pre-treat and to modify a silicon (Si) substrate to have a hydrophobic property. In this case, the contacting angle of the pre-treated Si substrate with respect to water was 92°.

Step 2: By using a gravure offset printing apparatus, an Ag paste (silver nano paste DGP, nano new material (ANP)) was coated on the pre-treated silicon substrate in Step 1 to form an Ag wiring having a line width of 20 to 500 μm and an interval of 20 to 2,000 μm. The thus formed wiring was heat treated on a hot-plate of 200° C. for 1 hour. After the heat treatment, the thickness of the Ag wiring was about 1 to 2 μm.

Step 3: On the Ag wiring formed in Step 2 and the silicon substrate, an ultraviolet (UV)-curable polymer (NOA74: norland optical adhesives 74) was coated to a liquid state film having a certain thickness by means of a doctor blading method and was cured by irradiating an ultraviolet light having a wavelength of 365 nm, to form a polymer layer having a thickness of 2 to 400 μm.

Step 4: The polymer layer formed in Step 3 was separated from the silicon substrate in Step 1 by applying a physical force to form an Ag wiring buried flexible substrate.

Example 7

Manufacture of a Metal Wiring Buried Flexible Substrate 7

Step 1: A PES substrate was cleaned by using acetone and isopropyl alcohol. The cleaned PES substrate illustrated a contacting angle of 81.4°.

Step 2: By using a gravure offset printing apparatus, an Ag paste (silver nano paste DGP, nano new material (ANP)) was coated on the cleaned PES substrate in Step 1 to form an Ag wiring having a line width of 20 to 500 μm and an interval of 20 to 2,000 μm. The thus formed wiring was heat treated on a hot-plate of 180° C. for 1 hour. After the heat treatment, the thickness of the Ag wiring was about 1 to 2 μm.

Step 3: On the Ag wiring formed in Step 2 and the PES substrate, an $O_2$ plasma treatment (process condition: an $O_2$ gas of 10 sccm, a process pressure of 0.1 Torr, and an RF power of 500 W) was conducted for 1 minute. In this case, the contacting angle of the plasma irradiated PES substrate with respect to water was 7.4°.

Step 4: On the plasma irradiated Ag wiring in Step 3 and the PES substrate, an epoxy resin (YD-134, Kukdo Chemical Co., Ltd.) and a curing agent (Jeffamin D230, Kukdo Chemical Co., Ltd.) were mixed by 3:1 in a volume ratio, coated to a liquid state film having a certain thickness by a doctor blading method and cured at 80° C. for 3 hours to manufacture a polymer layer having a thickness of 2 to 400 μm.

Step 5: The polymer layer formed in Step 4 was separated from the PES substrate in Step 1 by applying a physical force to form an Ag wiring buried flexible substrate.

Example 8

MANUFACTURE of a Metal Wiring Buried Flexible Substrate 8

Step 1: By using a gravure offset printing apparatus, an Ag paste (silver nano paste DGP, nano new material (ANP)) was coated on a polydimethyl siloxane (PDMS, contacting angle of 112.4°) substrate to form an Ag wiring having a line width of 20 to 500 μm and an interval of 20 to 2,000 μm. The thus formed wiring was heat treated on a hot-plate of 180° C. for 1 hour. After the heat treatment, the thickness of the Ag wiring was about 1 to 2 μm.

Step 2: On the Ag wiring formed in Step 1 and the PDMS substrate, an $O_2$ plasma treatment (process condition: an $O_2$ gas of 10 sccm, a process pressure of 0.1 Torr, and an RF power of 100 W) was conducted for 1 minute. In this case, the contacting angle of the plasma irradiated PDMS substrate with respect to water was 23.3°.

Step 3: On the Ag wiring formed in Step 2, a heat-curable polymer (polyimide, VTEC 080-051) was coated to a liquid state film having a certain thickness by a doctor blading method and cured in an oven of 200° C. to manufacture a polymer layer having a thickness of 2 to 400 μm.

Step 4: The polymer layer formed in Step 3 was separated from the PDMS substrate in Step 1 by applying a physical force to form an Ag wiring buried flexible substrate.

Example 9

Manufacture of a Metal Wiring Buried Flexible Substrate 9

Step 1: By using a gravure offset printing apparatus, an Ag paste (silver nano paste DGP, nano new material (ANP)) was coated on a paper foil (clean wrap, contacting angle of 112.5°) substrate to form an Ag wiring having a line width of 20 to 500 μm and an interval of 20 to 2,000 μm. The thus formed wiring was heat treated on a hot-plate of 180° C. for 1 hour. After the heat treatment, the thickness of the Ag wiring was about 1 to 2 μm.

Step 2: On the Ag wiring formed in Step 1 and the paper foil substrate, an $O_2$ plasma treatment (process condition: an $O_2$ gas of 10 sccm, a process pressure of 0.1 Torr, and an RF power of 500 W) was conducted for 5 minutes. In this case, the contacting angle of the plasma irradiated paper foil substrate with respect to water was 23.3°.

Step 3: On the plasma irradiated Ag wiring formed in Step 2 and the paper foil substrate, an ultraviolet (UV)-curable polymer (NOA74: norland optical adhesives 74) was coated to a liquid state film having a certain thickness by a doctor blading method and cured by irradiating an ultraviolet light having a wavelength of 365 nm to manufacture a polymer layer having a thickness of 2 to 400 μm.

Step 4: The polymer layer formed in Step 3 was separated from the paper foil substrate in Step 1 by applying a physical force to form an Ag wiring buried flexible substrate.

Comparative Example 1

The same process was conducted as described in Example 1 except for depositing diamond like carbon (DLC) as a separating material, and separating a flexible substrate from a glass substrate by applying a physical force. In this case, a DLC deposition was conducted by means of a plasma enhanced chemical vapor deposition (PECVD) method.

Comparative Example 2

The same process was conducted as described in Example 1 except for coating a Si releasing agent (KS839, Shin-Etsu Chemical Co., Ltd.) as a separating agent, and separating a flexible substrate from a glass substrate by applying a physical force.

Comparative Example 3

The same process was conducted as described in Example 1 except for obtaining the contacting angle of 16° for the pre-treated glass substrate with respect to water by irradiating the plasma in Step 1 in Example 1.

Comparative Example 4

The same process was conducted as described in Example 1 except for forming a metal wiring on a plasma untreated hydrophilic glass substrate having a contacting angle of 25° with respect to water.

Comparative Example 5

The same process was conducted as described in Example 4 except for omitting the plasma post-treatment in Step 3 in Example 4.

Experiment 1

Observation on Metal Wiring Buried Flexible Substrate

In order to observe the flexible substrates manufactured in Examples 1 to 3 and the metal wiring patterns buried in the flexible substrates manufactured in Comparative Examples 1 to 3, photographs on the manufactured flexible substrates are illustrated in FIGS. 3 to 7.

Figure 3:
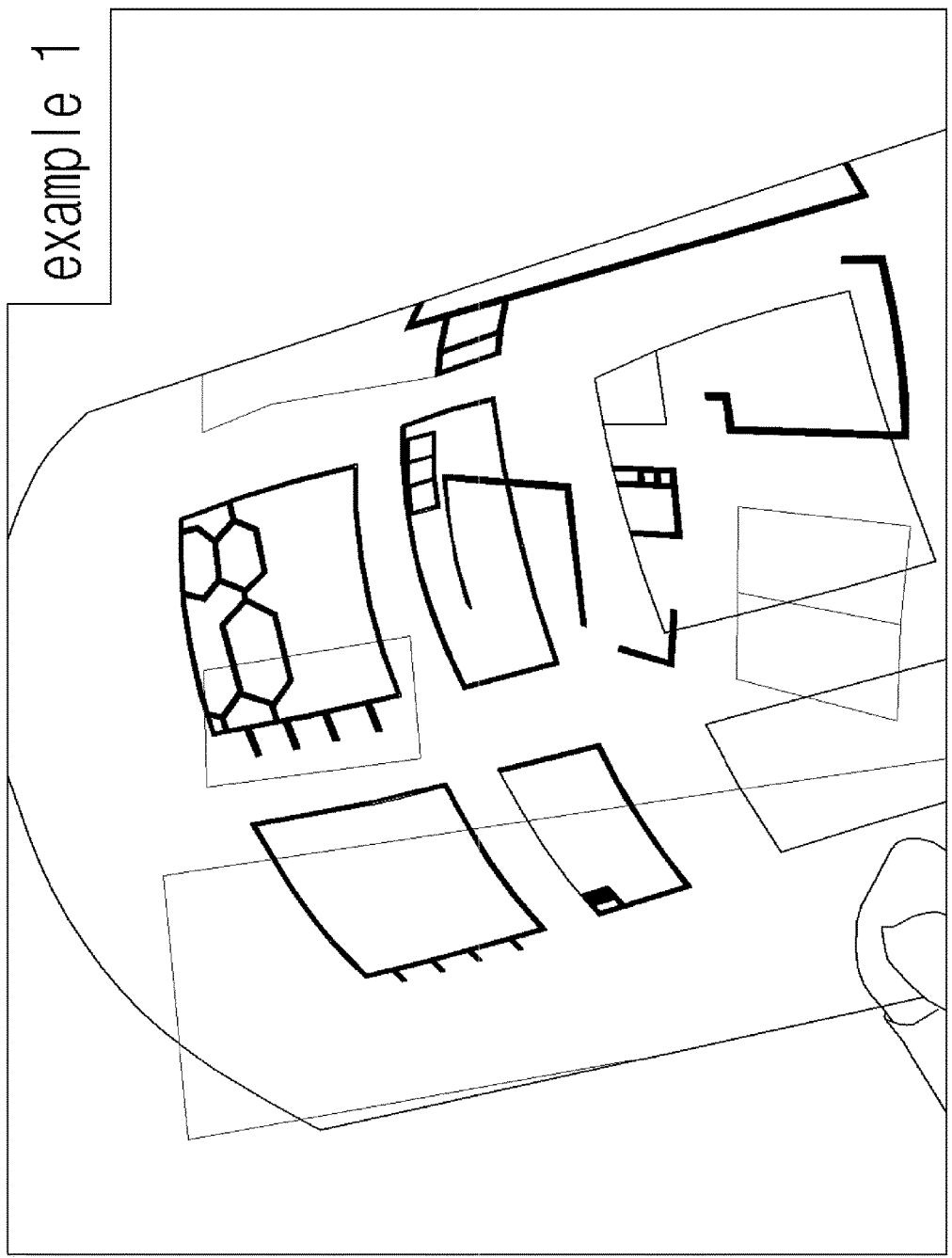
FIG. 3 is a photograph on a metal wiring buried flexible substrate manufactured in Example 1 according to the present invention.
Figure 4:
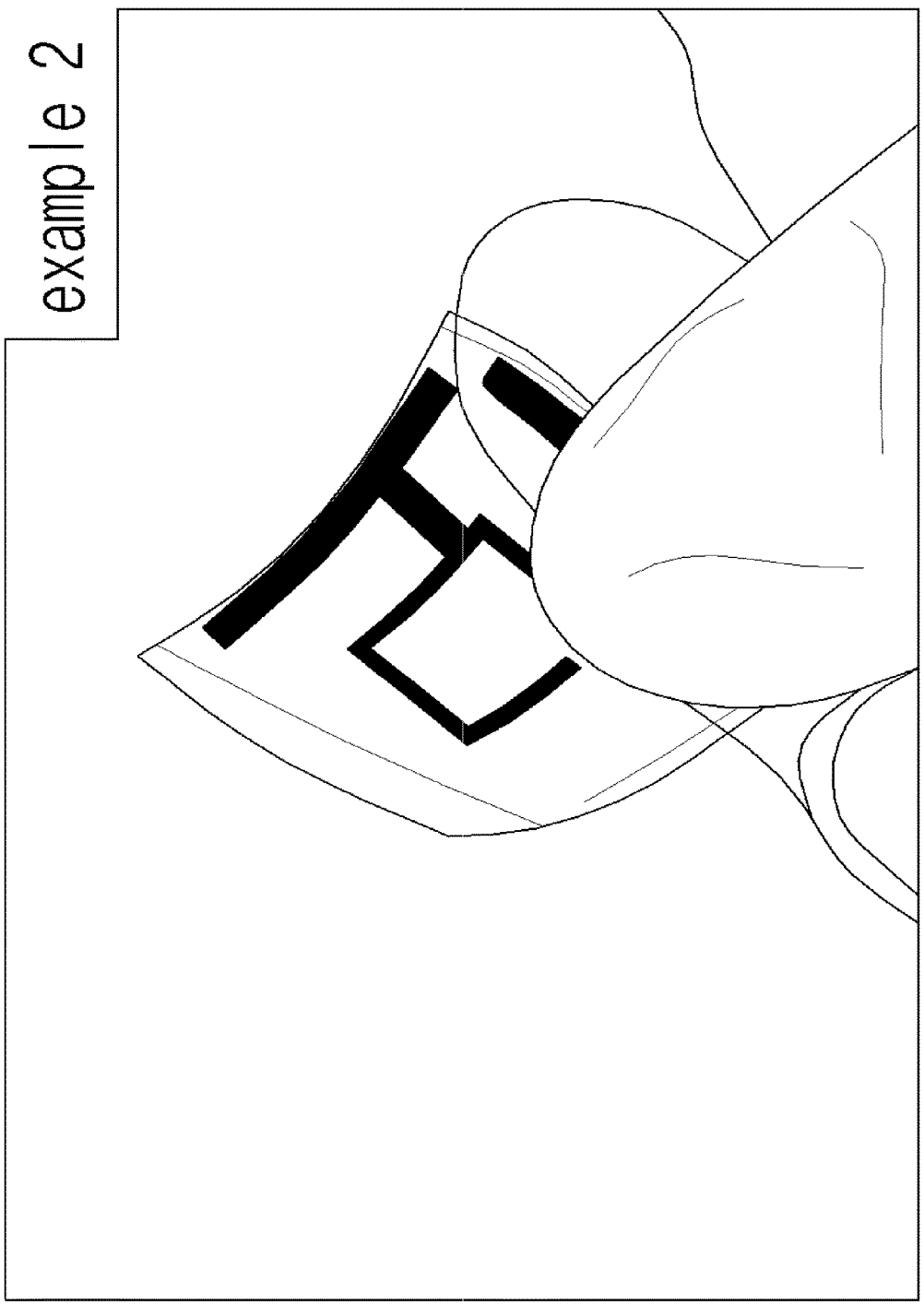
FIG. 4 is a photograph on a metal wiring buried flexible substrate manufactured in Example 2 according to the present invention.
Figure 5:
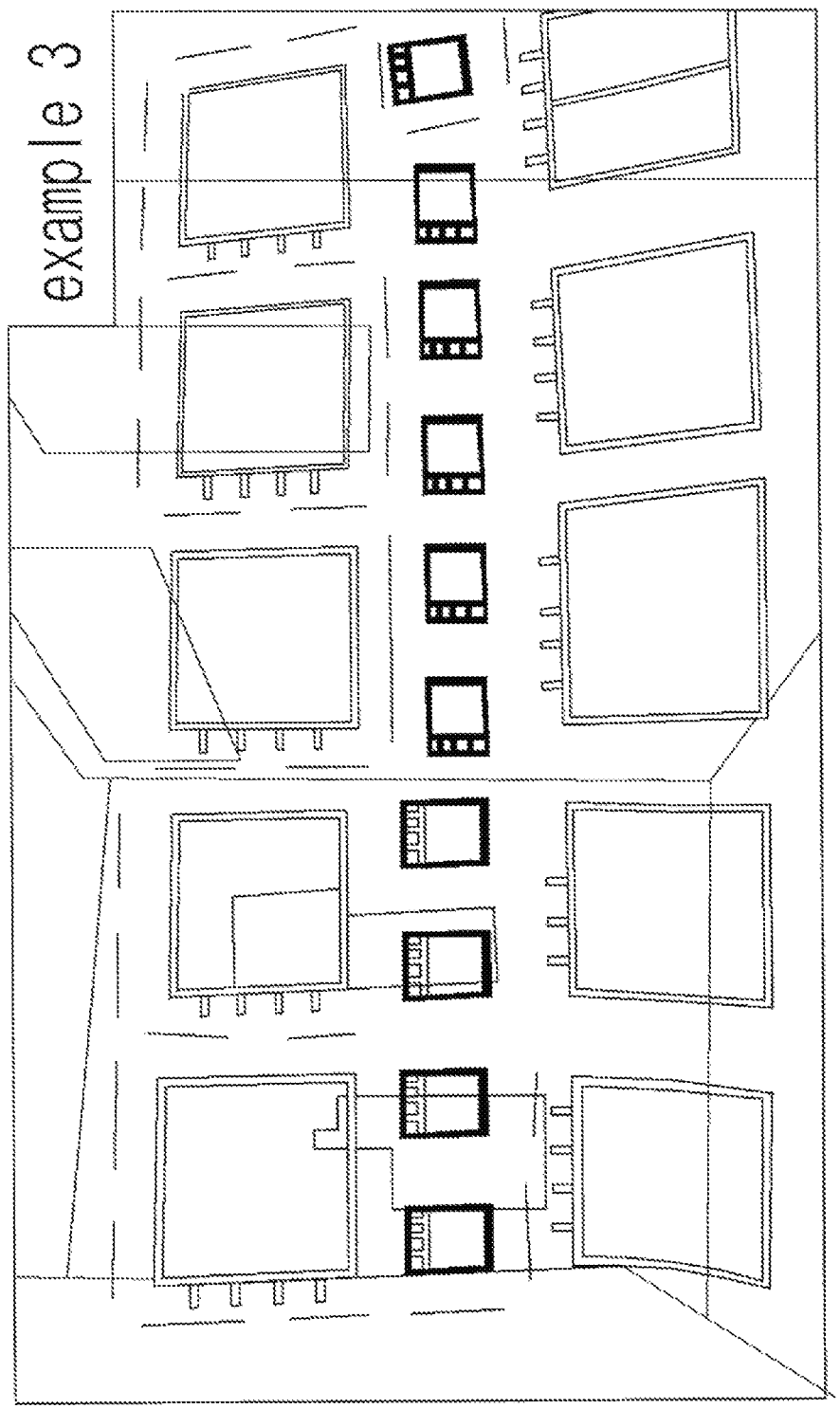
FIG. 5 is a photograph on a metal wiring buried flexible substrate manufactured in Example 3 according to the present invention.

As illustrated in FIGS. 3 to 5, for the flexible substrates manufactured in Examples 1 to 3 according to the method of the present invention, the metal wirings are found to be clearly separated from the substrates and the metal wiring patterns are clearly illustrated.

Figure 6:
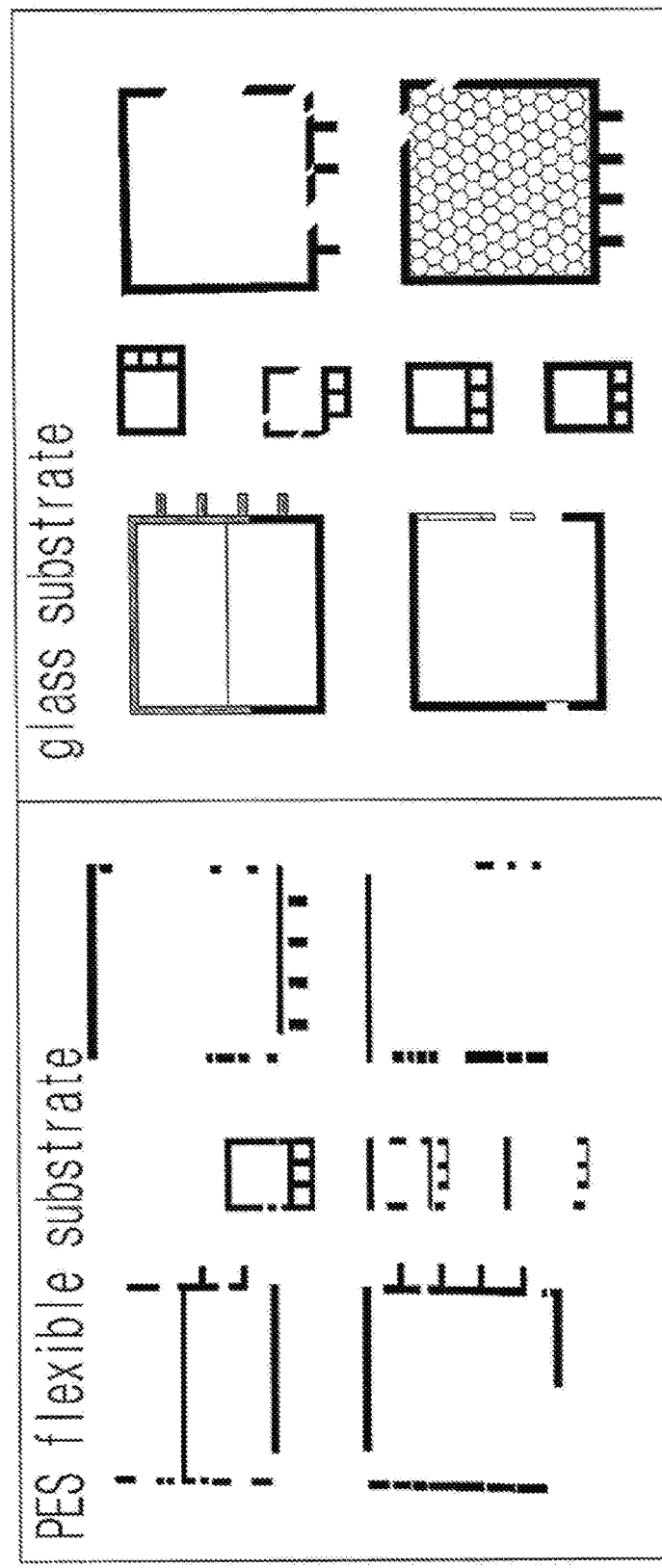
FIG. 6 is a photograph on a metal wiring buried flexible substrate manufacturing by using a separating agent in Comparative Example 1.

On the contrary, as illustrated in FIG. 6, for the flexible substrate manufactured by using the separating agent in Comparative Example 1, the separation of the metal wiring was not conducted easily, the metal wiring remained on the surface of the substrate, and a desired metal wiring pattern was not formed on the flexible substrate.

Figure 7:
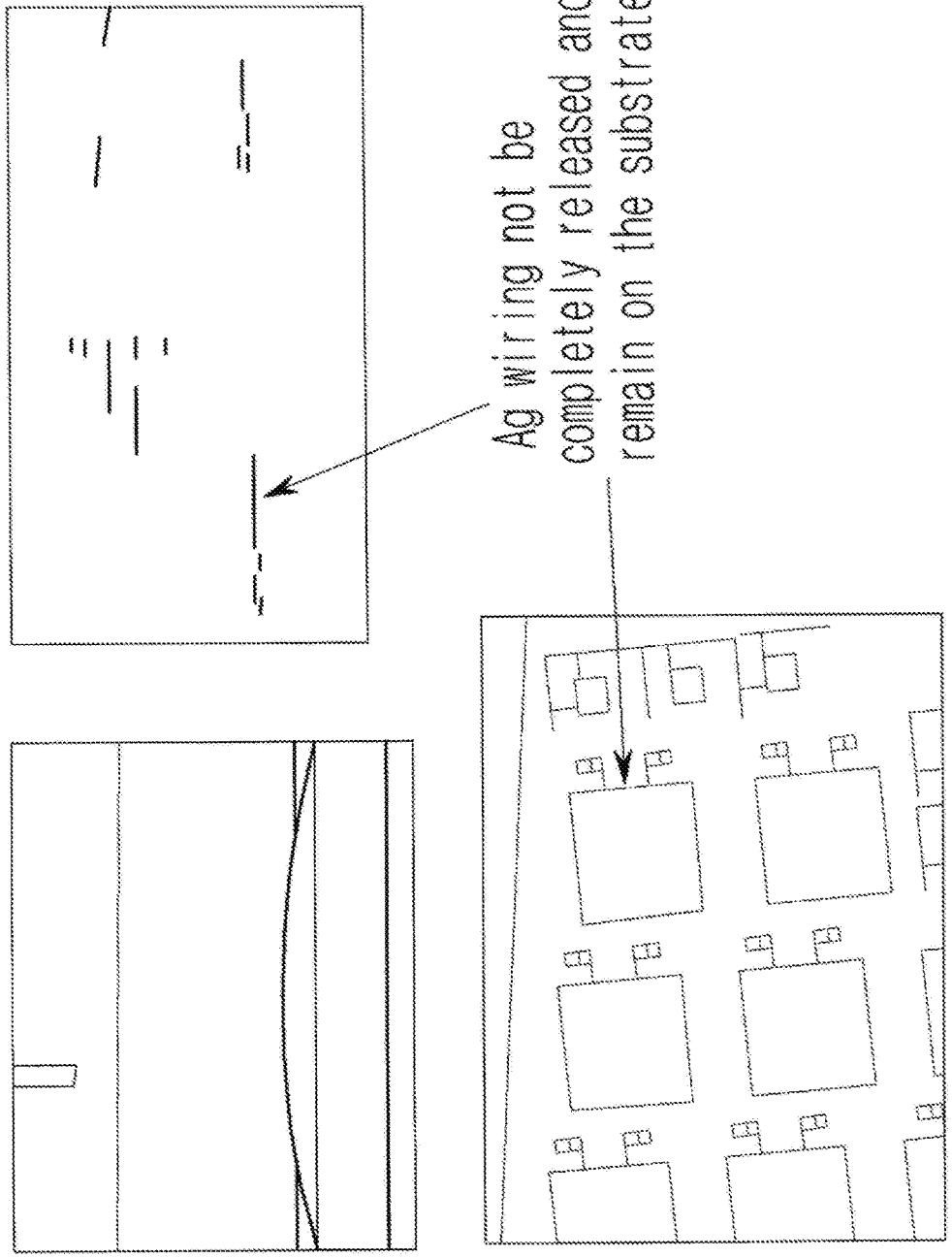
FIG. 7 illustrates photographs on a metal wiring buried flexible substrate manufactured by using a hydrophilic substrate in Comparative Example 3.

In addition, as illustrated in FIG. 7, for the flexible substrate manufactured by forming the metal wiring after pre-treating the glass substrate using the plasma so that the contacting angle of the glass substrate with respect to water being 16° in Comparative Example 3, the adhesiveness of the wiring and the substrate may be good. In this case, the wiring may not be completely released and remain on the glass substrate.

By pre-treating the substrate using the plasma before forming the metal wiring according to the manufacturing method of the present invention, the separation of the metal wiring may be easily conducted, and the manufacture of the metal wiring buried flexible substrate having a high quality may be confirmed.

Experiment 2

Analysis on Surface of Substrate after Plasma Treatment

In order to analyze the change of the surface state of a substrate by the surface treatment using a plasma, the contacting angle of a plasma treated substrate with respect to water was measured. The results are illustrated in FIGS. 8 to 13.

Figure 8:
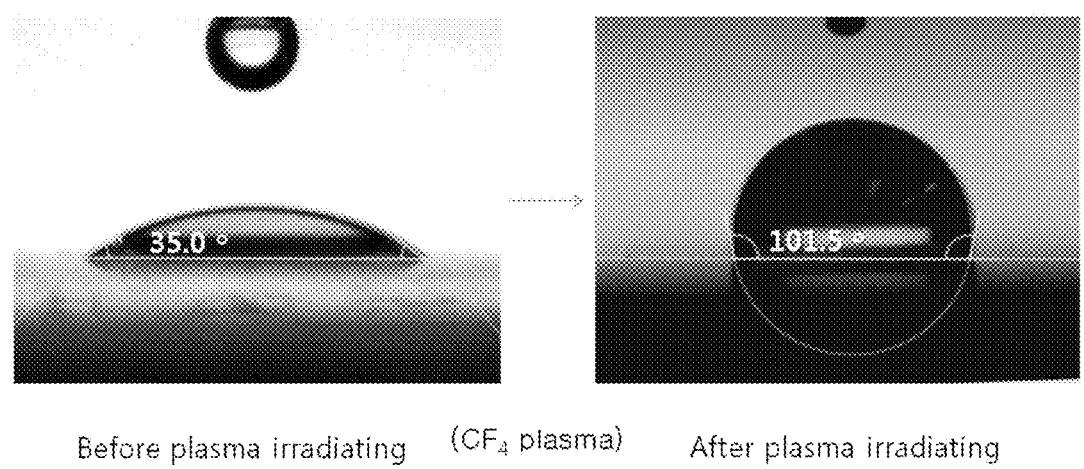
FIGS. 8 to 13 illustrate photographs on the contacting angle change of the surface of the substrate with respect to water according to a plasma irradiation.
Figure 9:
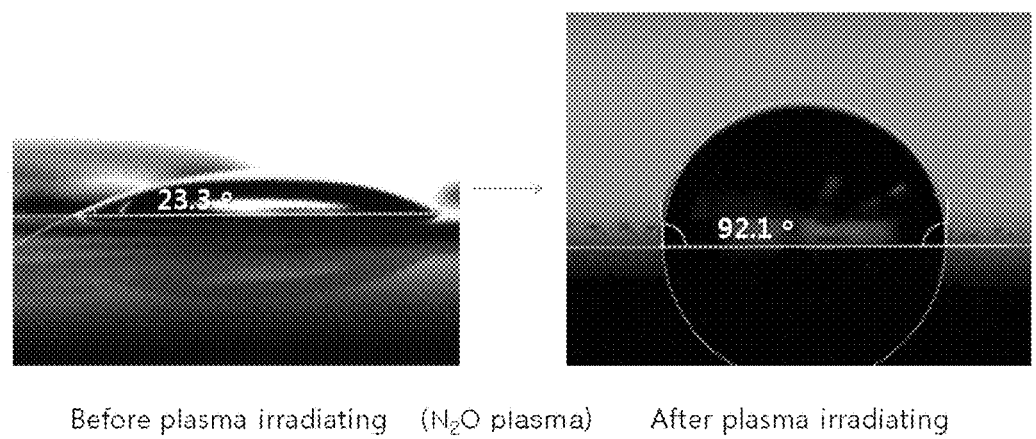
Figure 10:
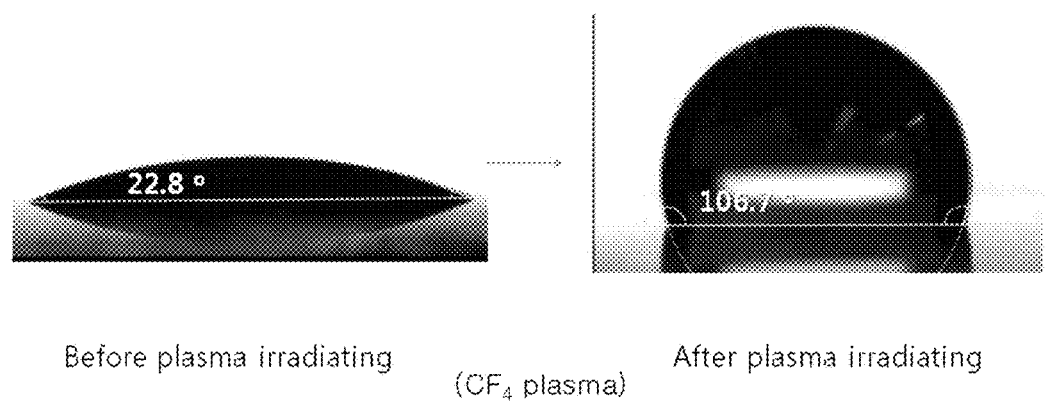

As illustrated in FIGS. 8 to 10, the surface of a glass substrate, a silicon (Si) substrate, or an STS flexible substrate may be treated to have a hydrophobic property by irradiating the plasma.

Figure 11:
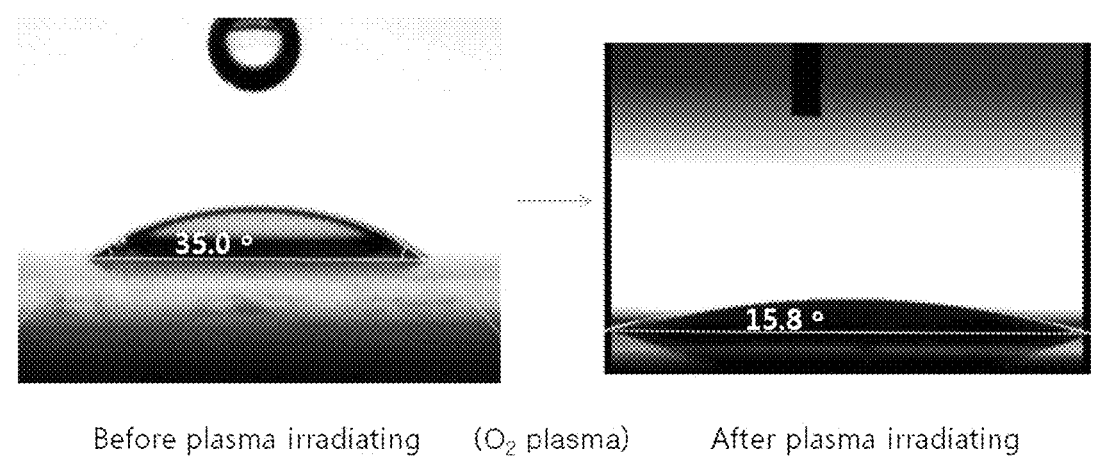
Figure 12:
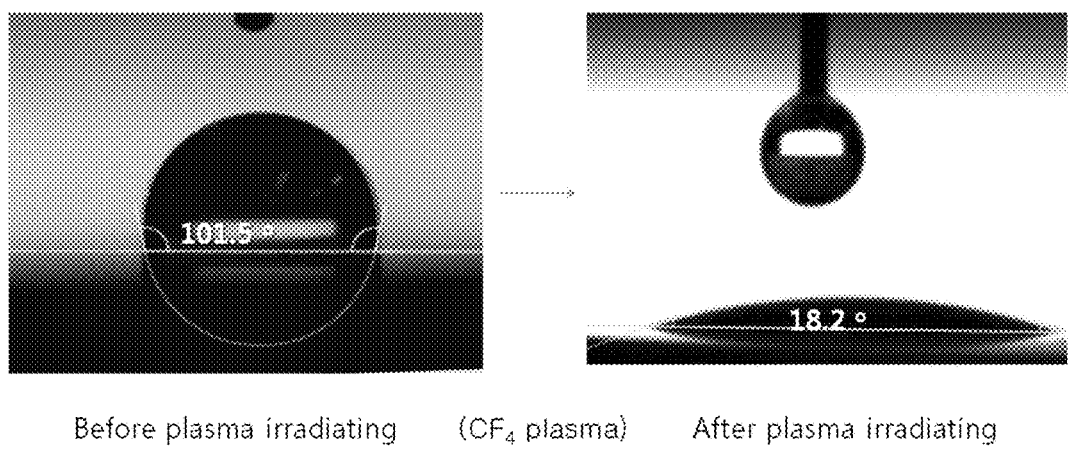
Figure 13:
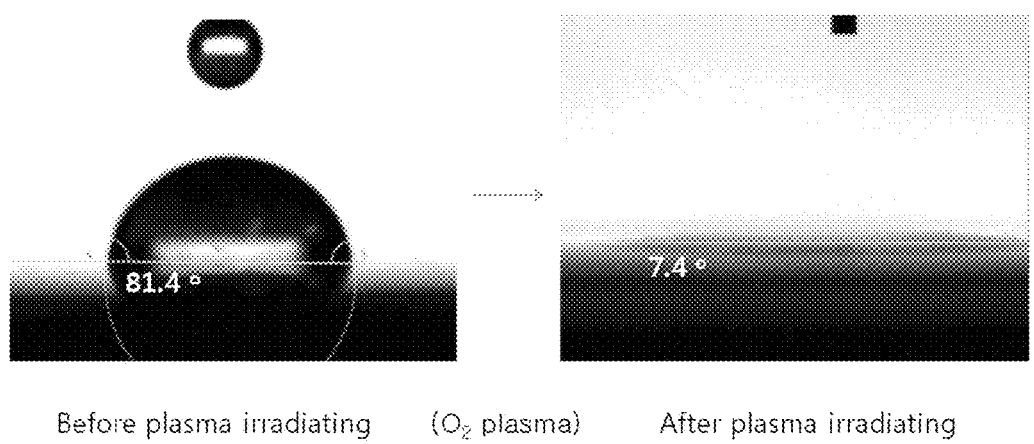

In addition, as illustrated in FIGS. 11 to 13, the substrate may be treated to have a hydrophilic property by irradiating the plasma. Particularly, a substrate having a strong hydrophobic property by irradiating the plasma may be changed to have a hydrophilic property by irradiating again the substrate with the plasma.

That is, the surface state of the substrate may be confirmed to be easily changed through the plasma irradiation. The substrate may be treated to have the hydrophobic property to facilitate the separation of the metal wiring and the curable polymer. Otherwise, the substrate may be treated to have the hydrophilic property to facilitate the coating of the curable polymer to manufacture the metal wiring buried flexible substrate having a high quality.

Experiment 3

Analysis on Properties of Metal Wiring after Plasma Treatment

The changes on the releasing property of a metal wiring formed on a hydrophilic substrate having a contacting angle of 25° with respect to water in Comparative Example 4, and a metal wiring having a contacting angle of 101° with respect to water through a hydrophobic plasma treatment before forming a wiring in Example 4 are illustrated in FIG. 14.

As illustrated in the left drawing in FIG. 14, the metal wiring formed on the hydrophobic substrate having a contacting angle of 101° with respect to water through a plasma treatment in Example 4 may be confirmed to be separated from the substrate very well.

On the contrary, as illustrated in the right drawing in FIG. 14, the metal wiring formed on the substrate having a contacting angle of 25° with respect to water in Comparative Example 4 may be confirmed to illustrate a difficult separation from the substrate. The manufacture of the metal wiring having a good releasing property may be confirmed to be formed by irradiating the substrate with the plasma before forming the wiring.

From the result, the separation of the wiring may be easily conducted by irradiating the substrate with a plasma before forming the wiring in the manufacturing method of the present invention.

Experiment 4

Analysis on Metal Wiring Property after Plasma Treatment

As in Example 4, for the plasma pre-treated substrate having a hydrophobic property and having a contacting angle of greater than 90° with respect to water before forming the wiring, and an additional plasma irradiation was conducted after forming the wiring, the change on the layer forming property of a curable polymer according to the plasma irradiation was observed. The results are illustrated in FIG. 15.

As illustrated in the left drawing in FIG. 15, when the additional plasma treatment was conducted to obtain a hydrophilic substrate after forming a metal wiring on a hydrophobic substrate having a contacting angle of 101° with respect to water in Example 4, a metal wiring buried flexible substrate having a high quality may be manufactured. In addition, the resistance of the metal wiring was largely decreased from 200Ω to 2Ω after the plasma irradiation due to the sintering effect of the metal wiring according to the plasma irradiation.

On the contrary, as illustrated in the right drawing in FIG. 15, for the hydrophobic substrate without being additionally treated by the plasma in Comparative Example 5, the coating of the curable polymer was poor and was conducted to form a biased shape to one side. Thus, the cured shape on the flexible substrate was found to be bad.

From the result, the curable polymer for forming a flexible substrate may be confirmed to be coated smoothly by additionally irradiating the plasma after forming a wiring in the manufacturing method according to the present invention. In addition, the resistance of the metal wiring may be confirmed to be decreased because of the sintering effect obtained after the plasma irradiation.

The invention claimed is:

1. A method of manufacturing a metal wiring buried flexible substrate by using a plasma comprising:
pre-treating a substrate by irradiating the plasma on the surface of the substrate (Step 1), the pre-treating by plasma irradiation changing the hydrophilicity of the substrate such that the pre-treated substrate has a contact angle between about 45 degrees and about 150 degrees with respect to water;
forming a metal wiring on the pre-treated substrate in Step 1 (Step 2);
forming a metal wiring buried polymer layer by coating a curable polymer on the substrate including the metal wiring formed thereon in Step 2 and curing (Step 3); and
separating the polymer layer formed in Step 3 from the substrate in Step 1 (Step 4) by solely applying a physical force to remove the polymer layer comprising the buried metal wiring from the substrate.

2. The method as set forth in claim 1, wherein the plasma in Step 1 is a plasma of at least one selected from the group consisting of Ar, $N_2O$, $CF_4$, $CH_4$, $C_2H_2$, $H_2O$, $C_2H_5OH$, hexamethyldisiloxane (HMDSO) and tetramethylsilane (TMS).

3. The method as set forth in claim 1, wherein a contacting angle of the surface of the substrate pre-treated in Step 1 with respect to water is 45° to 150°.

4. The method as set forth in claim 1, wherein a contacting angle of the surface of the substrate pre-treated in Step 1 with respect to water is 45° to 90°.

5. The method as set forth in claim 3, further comprising additionally irradiating the surface of the substrate including the metal wiring formed thereon with the plasma before coating the curable polymer in Step 3 when the contacting angle of the surface of the substrate pre-treated in Step 1 with respect to water is 90° to 150°.

6. The method as set forth in claim 5, wherein the contacting angle of the surface of the pre-treated and additionally plasma irradiated substrate including the metal wiring thereof with respect to water is 0° to 90°.

7. The method as set forth in claim 1, wherein the metal wiring is formed by coating silver (Ag), copper (Cu), aluminum (Al), gold (Au), platinum (Pt), nickel (Ni), titanium (Ti) or an alloy thereof.

8. The method as set forth in claim 1, wherein the metal wiring in Step 2 is formed by coating one selected from the group consisting of indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO—Ag—IZO), indium zinc tin oxide-silver-indium zinc tin oxide (IZTO-Ag-IZTO) and aluminum zinc oxide-silver-aluminum zinc oxide (AZO-Ag-AZO), or a mixture thereof.

9. The method as set forth in claim 1, wherein the metal wiring in Step 2 is formed by one method of an inkjet printing, a gravure printing, a gravure offset, an aerosol printing, a screen printing, an electroplating, a vacuum deposition or a photolithography process.

10. The method as set forth in claim 1, wherein the curable polymer in Step 3 is one selected from the group consisting of polyethylene terephthalate (PET), polyethylene sulfone (PES), polyethylene naphthalate (PEN), polycarbonate (PC), polymethyl methacrylate (PMMA), polyimide (PI), ethylene vinyl acetate (EVA), amorphous polyethylene terephthalate (APET), polypropylene terephthalate (PPT), polyethylene terephthalate glycerol (PETG), polycyclohexylene dimethylene terephthalate (PCTG), modified triacetyl cellulose (TAC), cycloolefin polymer (COP), cycloolefin copolymer (COC), dicyclopentadiene polymer (DCPD), cyclopentadiene polymer (CPD), polyarylate (PAR), polyether imide (PEI), polydimethyl siloxane (PDMS), a silicon resin, a fluorine resin and a modified epoxy resin.

11. The method as set forth in claim 1, wherein the curing in Step 3 is conducted by a thermal curing, an ultraviolet curing, a moisture curing, a dry curing, a chemical reaction curing, a microwave curing, an infrared (IR) curing or a cooling curing.

12. The method as set forth in claim 1, wherein the polymer layer formed in Step 3 and the substrate in Step 1 are separated by applying a physical force.

13. A metal wiring buried flexible substrate manufactured by the method as set forth in claim 1, a polymer layer and a metal wiring being integrated one by one, the metal wiring being provided in the polymer layer.

14. The flexible substrate as set forth in claim 13, wherein the flexible substrate is used in a solar battery, a flat lighting, an e-paper, a touch panel or a display substrate.

15. The flexible substrate as set forth in claim 13, wherein the flexible substrate is used as an auxiliary electrode of a material for a printed wiring board (PCB), a substrate for a solar battery, a substrate for displaying, a substrate for a radio frequency identification (RFID), a substrate for a sensor or a substrate for a secondary battery.

* * * * *